(12) United States Patent
Midorikawa

(10) Patent No.: US 11,572,623 B2
(45) Date of Patent: Feb. 7, 2023

(54) SUBSTRATE PROCESSING APPARATUS

(71) Applicant: TOKYO ELECTRON LIMITED, Tokyo (JP)

(72) Inventor: Yohei Midorikawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 708 days.

(21) Appl. No.: 15/713,164

(22) Filed: Sep. 22, 2017

(65) Prior Publication Data

US 2018/0096866 A1 Apr. 5, 2018

(30) Foreign Application Priority Data

Sep. 30, 2016 (JP) .............................. JP2016-192775

(51) Int. Cl.
*C23C 16/455* (2006.01)
*H01L 21/67* (2006.01)

(52) U.S. Cl.
CPC .. *C23C 16/45561* (2013.01); *H01L 21/67017* (2013.01); *H01L 21/6719* (2013.01); *H01L 21/67069* (2013.01); *H01L 21/67253* (2013.01)

(58) Field of Classification Search
CPC ............. H01J 37/32431; H01J 37/3244; H01J 37/32449; H01J 37/32816; H01J 37/32825; H01J 37/32834; H01J 37/32889; H01J 37/32899; H01L 21/67069; H01L 21/6719; H01L 21/67253; H01L 21/67155;

(Continued)

(56) References Cited

U.S. PATENT DOCUMENTS 5,415,585 A * 5/1995 Miyagi ............... C23C 16/4412
422/152
6,228,170 B1 * 5/2001 Chen ................. C23C 16/45557
118/663

(Continued)

FOREIGN PATENT DOCUMENTS

| JP | 2016-29700 A | 3/2016 |
|---|---|---|
| KR | 2003-0044642 A | 6/2003 |
| KR | 10-2016-0046302 A | 4/2016 |

*Primary Examiner* — Benjamin Kendall
*Assistant Examiner* — Kurt Sweely
(74) *Attorney, Agent, or Firm* — Nath, Goldberg & Meyer; Jerald L. Meyer; Tanya E. Harkins

(57) ABSTRACT

A substrate processing apparatus includes processing parts performing substrate processing on target substrates, respectively, substrate mounting tables mounting the target substrates thereon in the respective processing parts, gas introducing members introducing processing gases into processing spaces, a common exhaust mechanism evacuating the processing spaces at once and further performing pressure control for the processing spaces at once, and a pressure measuring part configured to selectively monitor a pressure in any one of the plurality of processing spaces by using a pressure gauge. The pressure measuring part includes pipelines having pressure-measuring pipelines configured to connect the processing spaces to the pressure gauge and dummy pipelines configured to communicate with the processing spaces, which adjust a difference between a volume of the pipelines communicating with a monitored processing space of the processing spaces and a volume of the pipelines communicating with each of non-monitored processing spaces.

10 Claims, 9 Drawing Sheets

(58) Field of Classification Search
CPC ......... H01L 21/67017; C23C 16/45561; C23C 16/45582; C23C 16/45557; C23C 16/45587; C23C 16/45591; C23C 16/4412; C23C 14/0042; C23C 14/0063; C23C 14/544; C23C 16/4408; C23C 16/45512
See application file for complete search history.

(56) References Cited

U.S. PATENT DOCUMENTS

| | | | |
|---|---|---|---|
| 6,279,402 B1 * | 8/2001 | Fisher | C23C 16/45557 73/754 |
| 2006/0021568 A1 * | 2/2006 | Matsumoto | C23C 16/455 118/62 |
| 2011/0031214 A1 * | 2/2011 | Kim | C23C 16/4412 216/59 |
| 2012/0304930 A1 * | 12/2012 | Verdict | C23C 16/4407 118/715 |

* cited by examiner

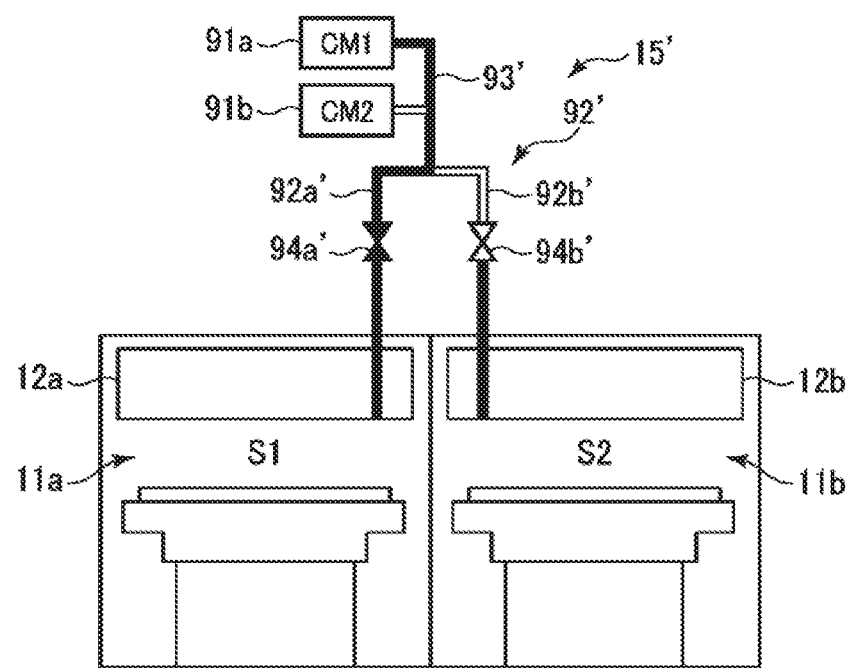

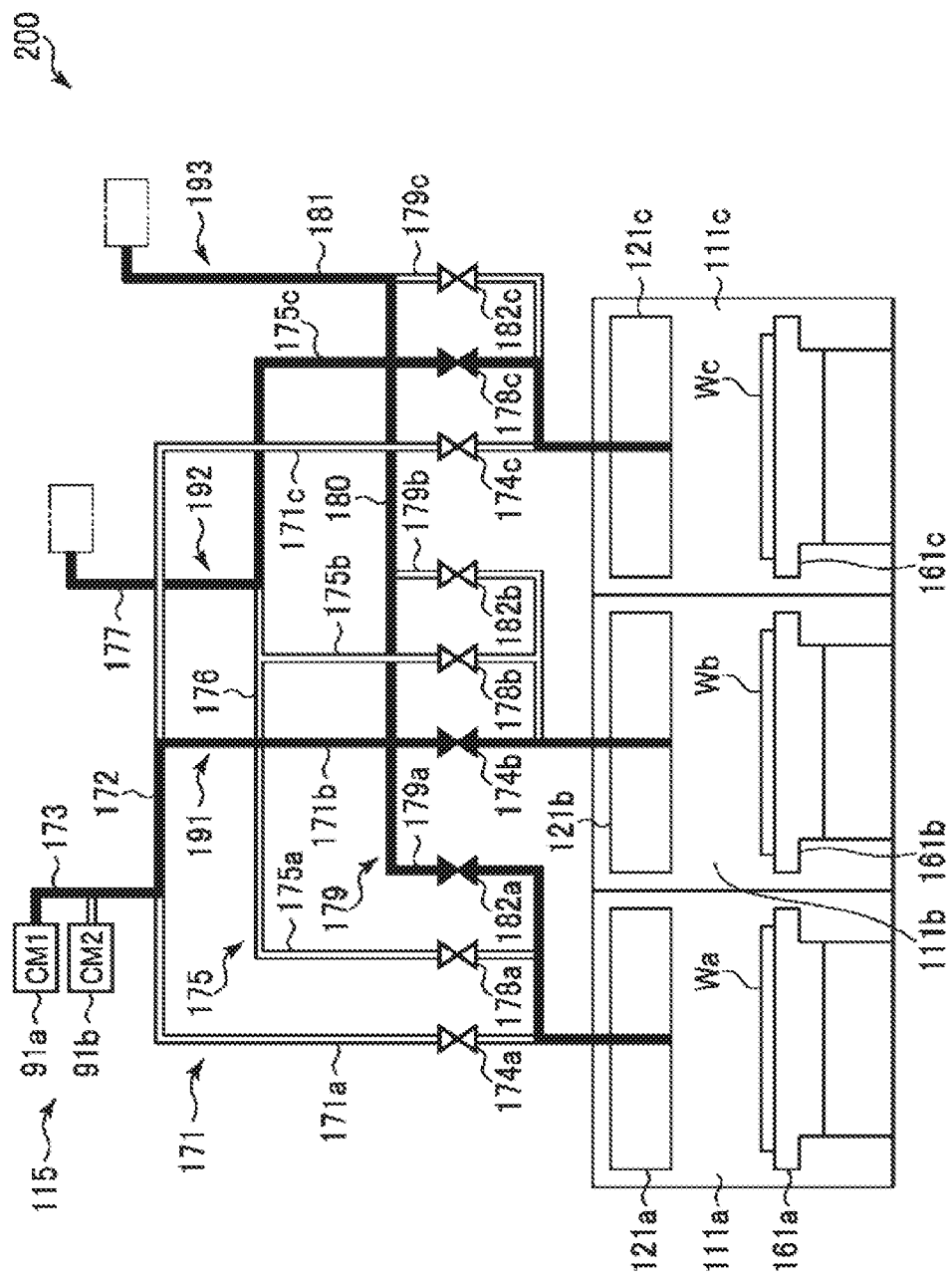

SUBSTRATE PROCESSING APPARATUS

CROSS-REFERENCE TO RELATED APPLICATION

This application is based upon and claims the benefit of priority from Japanese Patent Application No. 2016-192775, filed Sep. 30, 2016, the entire contents of which are incorporated herein by reference.

TECHNICAL FIELD

The present disclosure relates to a substrate processing apparatus.

BACKGROUND

In fabricating a semiconductor device, a process such as an etching process, film-forming process or the like using gases is performed on a semiconductor wafer (hereinafter, simply referred to as "wafer") which is a target substrate.

Conventionally, for such substrate processing, a single-substrate type processing apparatus for processing substrates one by one has been widely used. From the viewpoint of improvement of throughput, however, there has been proposed a substrate processing apparatus in which a plurality of target substrates is placed in one chamber and then subjected to a predetermined process all at once.

In this substrate processing apparatus, a plurality of processing spaces is defined in one chamber, a target substrate is mounted on a substrate mounting table provided in each of the processing spaces, process gases are supplied independently to each of the processing spaces to perform the processes, and the chamber is exhausted all at once by one exhaust device.

A capacitance manometer as a pressure gauge is provided in each of the processing spaces and a pressure of each of the processing spaces is monitored by the capacitance manometer.

However, when the capacitance manometers as pressure gauges are provided in the respective processing spaces, an error may occur due to a variation among the capacitance manometers. Thus, it is difficult to measure accurate pressures.

For this reason, it is conceivable that when pressures are measured by one capacitance manometer as a pressure gauge, pressures in the plurality of processing spaces can be monitored by switching valves in pressure-measuring pipelines connected to the processing spaces from the capacitance manometer. In such a case, the volume of the pressure-measuring pipeline of the capacitance manometer to a monitored processing space of which pressure is monitored is different from the volume of the pressure-measuring pipelines of the capacitance manometer to a non-monitored processing space of which pressure is not monitored. Accordingly, there is a difference in influence of gases remaining in the pipelines on a process.

SUMMARY

Some embodiments of the present disclosure provide a technique in a substrate processing apparatus for processing a plurality of target substrates in a plurality of processing spaces, by which influence on the process by gases remaining in pipelines can be reduced between a monitored processing space and a non-monitored processing space when the pressures in the plurality of processing spaces are monitored by one pressure gauge.

According to one embodiment of the present disclosure, there is provided a substrate processing apparatus, including: a plurality of processing parts configured to perform substrate processing on target substrates, respectively; a plurality of substrate mounting tables configured to mount the target substrates thereon in the respective processing parts; a plurality of gas introducing members configured to introduce processing gases into processing spaces of the respective processing parts; a common exhaust mechanism configured to evacuate the processing spaces of the processing parts all at once and further to perform pressure control for the processing spaces all at once; and a pressure measuring part configured to selectively monitor a pressure in any one of the plurality of processing spaces by using a pressure gauge, wherein the pressure measuring part includes pipelines having pressure-measuring pipelines configured to connect the plurality of processing spaces to the pressure gauge and dummy pipelines configured to communicate with the processing spaces, and valves configured to switch the pressure-measuring pipelines and the dummy pipelines, wherein the dummy pipelines are configured to adjust a difference between a volume of the pipelines communicating with a monitored processing space of the plurality of processing spaces and a volume of the pipelines communicating with each of non-monitored processing spaces.

According to another embodiment of the present disclosure, there is provided a substrate processing apparatus, including: two processing parts configured to perform substrate processing on target substrates, respectively; two mounting tables configured to mount the target substrates thereon in the respective processing parts; two gas introducing members configured to introduce processing gases into processing spaces of the respective processing parts; a common exhaust mechanism configured to evacuate the two processing spaces of the two processing parts all at once and further to perform pressure control for the processing spaces all at once; and a pressure measuring part configured to selectively monitor a pressure in any one of the two processing spaces by using a pressure gauge, wherein the pressure measuring part includes pipelines having two pressure-measuring pipelines configured to connect the two processing spaces to the pressure gauge, two dummy pipelines configured to communicate with the two pressure-measuring pipelines, respectively, and valves provided in the two pressure-measuring pipelines and the two dummy pipelines, respectively, wherein in a monitored processing space of the two processing spaces where a pressure is monitored, the valve provided in the pressure-measuring pipeline is opened to allow the corresponding processing space to communicate with the pressure gauge, and the valve provided in the dummy pipeline is closed, wherein in a non-monitored processing space of the two processing spaces where a pressure is not monitored, the valve provided in the dummy pipeline is opened and the corresponding processing space communicates with the dummy pipeline, and wherein the dummy pipelines are configured to adjust a difference between a volume of the pipelines communicating with the monitored processing space and a volume of the pipelines communicating with the non-monitored processing space.

BRIEF DESCRIPTION OF DRAWINGS

The accompanying drawings, which are incorporated in and constitute a part of the specification, illustrate embodi

FIG. 5 is a view illustrating pipeline routes which are in communication with the respective processing spaces in a case where the processing space S1 is a monitored processing space and the processing space S2 is a non-monitored processing space, in the pressure measuring part shown in FIG. 4.

FIG. 9 is a view illustrating pipeline routes which are in communication with processing spaces S11, S12 and S13 when a pressure in the processing space S12 is monitored, in the substrate processing apparatus of FIG. 8.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Substrate Processing Apparatus

Figure 1:
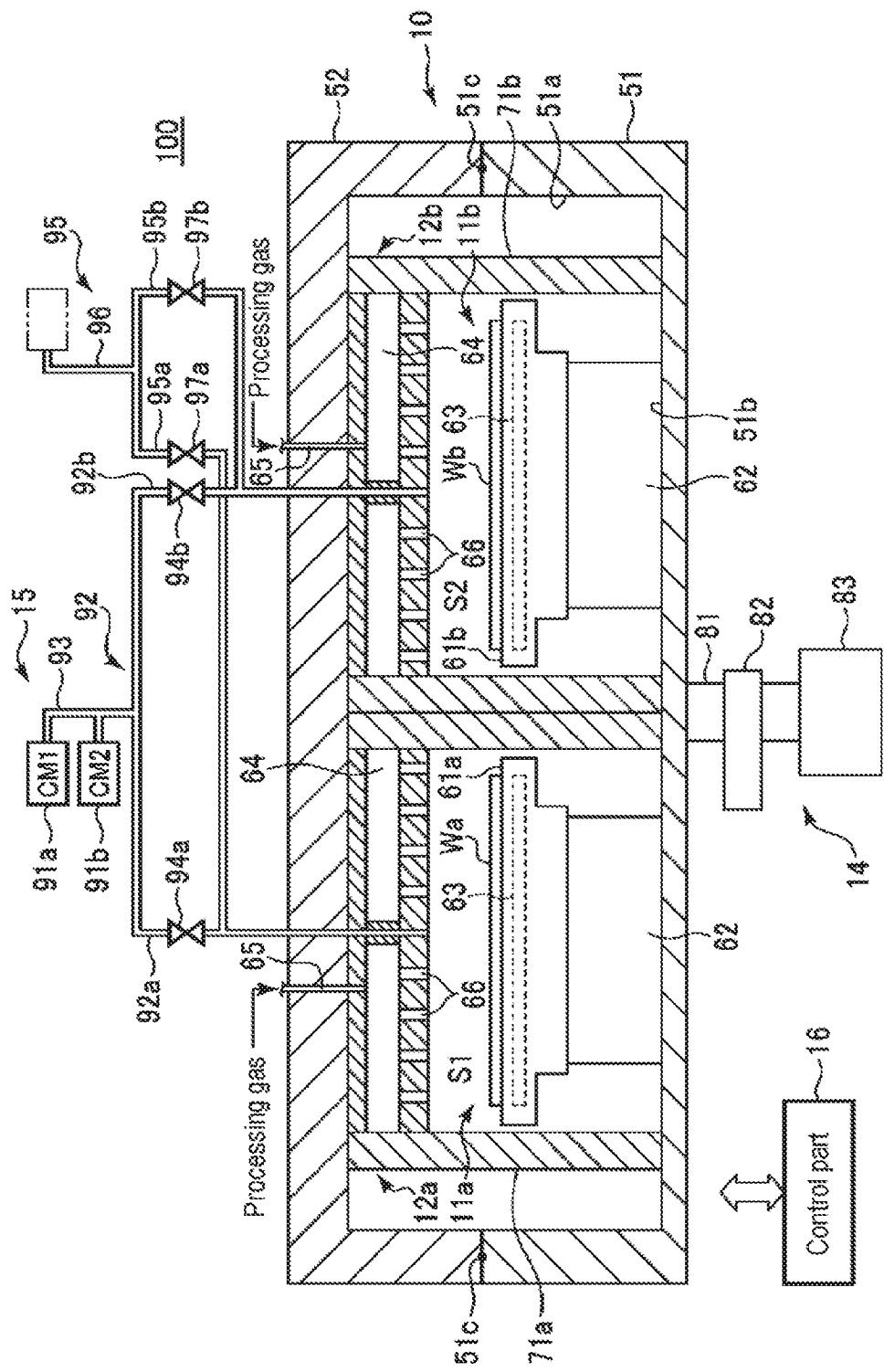
- FIG. 1 is a sectional view showing a substrate processing apparatus according to one embodiment of the present disclosure.

FIG. 1 is a sectional view illustrating a substrate processing apparatus according to one embodiment of the present disclosure.

The substrate processing apparatus according to this embodiment simultaneously supplies predetermined processing gases to two target substrates to perform a predetermined process. A case where etching process is performed on the target substrates by supplying etching gases as processing gases will be described by way of example. Examples of the etching process may include chemical oxide removal (COR) in which a silicon oxide film is etched using HF gas and $NH_3$ gas.

As shown in FIG. 1, the substrate processing apparatus 100 includes a chamber 10 having a hermetic structure. The chamber 10 is made of, for example, aluminum or an aluminum alloy and is comprised of a chamber main body 51 and a lid part 52. The chamber main body 51 has a sidewall portion 51a and a bottom portion 51b and also has an opening defined at an upper portion of the chamber main body, and this opening is closed by the lid part 52. The sidewall portion 51a and the lid part 52 are hermetically sealed by a seal member 51c to secure airtightness in the chamber 10.

Two processing parts 11a and 11b are provided in the chamber 10, and substrate mounting tables 61a and 61b are installed in the two processing parts 11a and 11b, respectively. Wafers Wa and Wb, which are target substrates, are horizontally mounted one by one on the substrate mounting tables 61a and 61b. Gas introducing members 12a and 12b for introducing processing gases into the chamber 10 are provided above the substrate mounting tables 61a and 61b. The gas introducing members 12a and 12b are provided on an inner side with respect to the lid part 52. The gas introducing members 12a and 12b are provided to face the substrate mounting tables 61a and 61b, respectively. In addition, an inner wall 71a having a cylindrical shape is provided to surround the gas introducing member 12a and the substrate mounting table 61a, and an inner wall 71b having a cylindrical shape is provided to surround the gas introducing member 12b and the substrate mounting table 61b. The inner walls 71a and 71b are provided to extend from an inner side of an upper wall of the lid part 52 to the bottom portion 51b of the chamber main body 51, and upper portions of the inner walls define sidewalls of the gas introducing members 12a and 12b, respectively. A space between the gas introducing member 12a and the substrate mounting table 61a and a space between the gas introducing member 12b and the substrate mounting table 61b are generally sealed by the inner walls 71a and 71b, respectively, to form the independent processing spaces S1 and S2 in which substrate processing are performed on the wafers Wa and Wb, respectively.

A loading/unloading port (not shown) used for transferring the wafer W between the inside and outside of the chamber main body 51 is provided on the side wall portion 51a of the chamber main body 51. This loading/unloading port can be opened and closed by a gate valve (not shown). In addition, loading/unloading ports (not shown) are also provided in the inner walls 71a and 72b, respectively, and these loading/unloading ports can be opened and closed by shutters (not shown). The inner walls 71a and 71b may be configured to be vertically movable between a position where they define the processing spaces S1 and S2 and a position below the substrate mounting tables 61a and 61b.

A gas supply mechanism (not shown) for supplying gases to the gas introducing members 12a and 12b, an exhaust mechanism 14 for evacuating the chamber 10, a pressure measuring part 15 for selectively measuring pressures in the processing spaces S1 and S2, and a control part 16 for controlling the respective parts of the substrate processing apparatus 100 are provided outside the chamber 10.

Each of the substrate mounting tables 61a and 61b is supported by a base block 62. The base block 62 is fixed to the bottom portion 51b of the chamber main body 51. A temperature controller 63 for adjusting a temperature of the wafer W is provided within each of the substrate mounting tables 61a and 61b. The temperature controller 63 is provided with a conduit through which, for example, a temperature regulating medium (e.g., water) is circulated, and the temperature of the wafer W is controlled by heat exchange between the substrate mounting table and the temperature regulating medium flowing through the conduit. Moreover, a plurality of lift pins (not shown) used for transferring the wafer W are provided in each of the substrate mounting tables 61a and 61b such that the lift pins can protrude/retract with respect to a wafer mounting surface.

The gas introducing members 12a and 12b are provided to introduce the processing gases from the gas supply mechanism into the chamber 10 and subsequently to supply them to the processing parts 11a and 11b. For example, HF gas and $NH_3$ gas for etching an oxide are supplied as etching gases, and Ar gas and $N_2$ gas are supplied as dilution gases or purge gases from the gas supply equipment. Each of the gas introducing members 12a and 12b has a gas diffusion space 64 formed therein and are cylindrical in overall shape. Gas introducing holes 65 extending from an upper wall of the chamber 10 are formed in an upper portion of each of the gas introducing members 12a and 12b, and a plurality of gas discharging holes 66 connected to the gas diffusion space 64 is formed in a bottom portion of each of the gas introducing members. The processing gases supplied from the gas supply mechanism reach the gas diffusion spaces 64 via the gas introducing holes 65 and are diffused in the gas diffusion spaces 64 so that the processing gases are uniformly discharged into the processing spaces S1 and S2 in the form of a shower through the gas discharging holes 66. In other words, the gas introducing members 12a and 12b function as gas dispersion heads (shower heads) for dispersing and discharging the gases.

The exhaust mechanism 14 has an exhaust pipeline 81 connected to an exhaust port (not shown) formed in the bottom portion 51b of the chamber 10 and further has an automatic pressure control valve (APC) 82 provided in the exhaust pipeline 81 for controlling a pressure in the chamber 10, and a vacuum pump 83 for evacuating the chamber 10, The exhaust port is provided outside the inner walls 71a and 71b, and a plurality of slits are formed in portions of the inner walls 71a and 71b which are below the substrate mounting tables 61a and 61b so that the processing parts 11a and 11b can be evacuated through both sides of each of the processing parts by the exhaust mechanism 14. Accordingly, the processing parts 11a and 11b are evacuated all at once by the exhaust mechanism 14. The APC 82 and the vacuum pump 83 are shared by the processing parts 11a and 11b.

The pressure measuring part 15 has a capacitance manometer 91a for high pressure and a capacitance manometer 91b for low pressure, which are provided above the chamber 10 and serve as pressure gauges, and a pressure-measuring pipeline unit 92. The pressure-measuring pipeline unit 92 has a first pressure-measuring pipeline 92a and a second pressure-measuring pipeline 92b. The first pressure-measuring pipeline 92a is inserted into a center of the gas introducing member 12a from above, and the second pressure-measuring pipeline 92b is inserted into a center of the gas introducing member 12b from above. Lower ends of the first pressure-measuring pipeline 92a and the second pressure-measuring pipeline 92b reach centers of the bottom portions of the gas introducing members 12a and 12b, respectively.

The pressure-measuring pipeline unit 92 further has an upper pipeline 93 to which the capacitance manometers 91a and 91b are directly connected, and the upper pipeline 93 is branched off into the first pressure-measuring pipeline 92a and the second pressure-measuring pipeline 92b. A first valve 94a is provided in the first pressure-measuring pipeline 92a and a second valve 94b is provided in the second pressure-measuring pipeline 92b.

Further, the pressure measuring part 15 has a dummy pipeline unit 95. The dummy pipeline unit 95 has a first dummy pipeline 95a connected to the first pressure-measuring pipeline 92a, a second dummy pipeline 95b connected to the second pressure-measuring pipeline 92b, and an upper dummy pipeline 96. A leading end of the upper dummy pipeline 96 is occluded. The upper dummy pipeline 96 is branched off into the first dummy pipeline 95a and the second dummy pipeline 95b. A third valve 97a is provided in the first dummy pipeline 95a and a fourth valve 97b is provided in the second dummy pipeline 95b. The upper dummy pipeline 96 corresponds to the upper pipeline 93, the first dummy pipeline 95a corresponds to the first pressure-measuring pipeline 92a, and the second dummy pipeline 95b corresponds to the second pressure-measuring pipeline 92b. The leading end of the upper dummy pipeline 96 may be configured to be mounted with a capacitance manometer for checking a pressure.

The pressure measuring part 15 is configured to be capable of monitoring (measuring) a pressure in either of the processing space S1 of the processing part 11a and the processing space S2 of the processing part 11b. Depending on a recipe of the process performed in the processing parts 11a and 11b, one of the processing spaces S1 and S2 is predetermined as a monitored processing space and the other thereof is predetermined as a non-monitored processing space. For example, in the case of a recipe in which etching using $NH_3$ and HF is initiated in both the processing parts 11a and 11b and the etching in the processing part 11b is first halted, the processing space S1 of the processing part 11a is set as the monitored processing space. The first dummy pipeline 95a and the second dummy pipeline 95b have functions of adjusting the volumes of pipelines which are in communication with the processing spaces S1 and S2 when the processing spaces S1 and S2 are not monitored.

Figure 2:
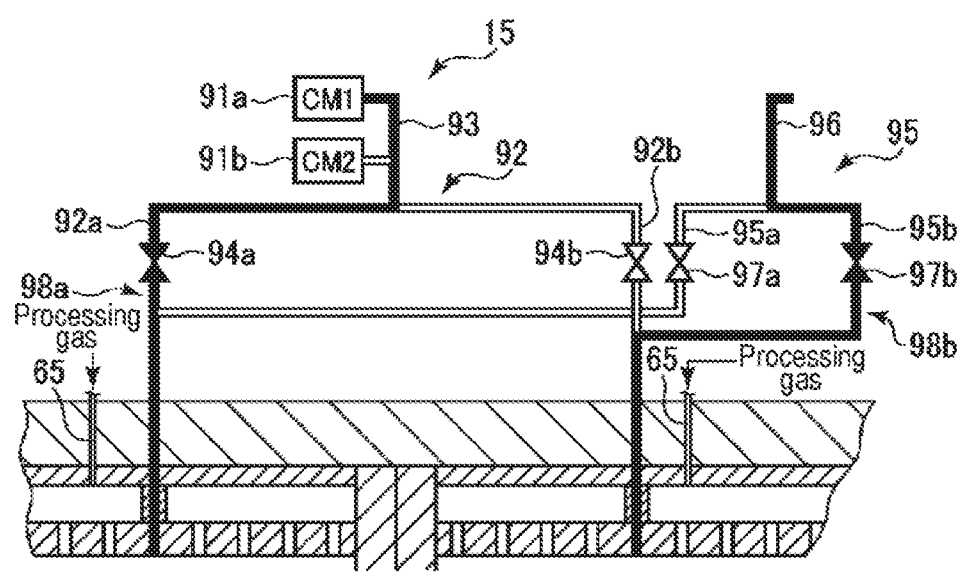
FIG. 2 is a view illustrating pipeline routes which are in communication with processing spaces S1 and S2 when a pressure in the processing space S1 is monitored, in the substrate processing apparatus of FIG. 1.

When the pressure in the processing space S1 is monitored by the pressure measuring part 15, the first valve 94a is opened and the second valve 94b is closed in the pressure-measuring pipeline unit 92, so that the capacitance manometers 91a and 91b communicate with the monitored processing space S1 and communication between the capacitance manometers 91a and 91b and the non-monitored processing space S2 is blocked. At this time, the third valve 97a of the dummy pipeline unit 95 is closed and the fourth valve 97b is opened. Accordingly, as for the monitored processing space S1, a pipeline route 98a indicated by a black line is formed from an end of the first pressure-measuring pipeline 92a, which faces the processing space S1, through the first pressure-measuring pipeline 92a and the upper pipeline 93 to a connection portion of the capacitance manometer 91a, as shown in FIG. 2. Meanwhile, as for the processing space S2, a dummy pipeline route 98b indicated by a black line is formed from an end of the second pressure-measuring pipeline 92b, which faces the processing space S2, through the second pressure-measuring pipeline 92b, the second dummy pipeline 95b and the upper dummy pipeline 96 to the leading end of the upper dummy pipeline 96.

Figure 3:
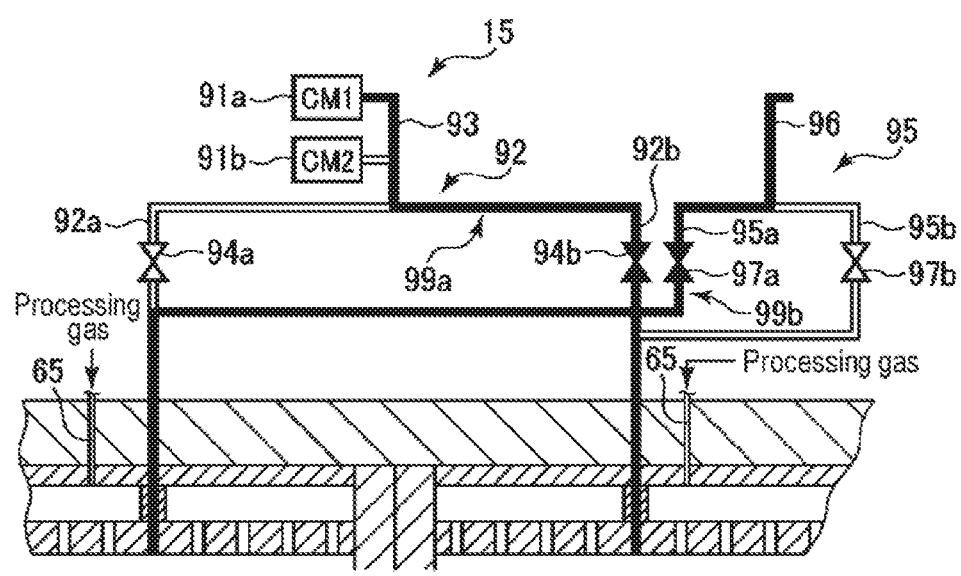
FIG. 3 is a view illustrating pipeline routes which are in communication with the processing spaces S1 and S2 when a pressure in the processing space S2 is monitored, in the substrate processing apparatus of FIG. 1.

When the pressure in the processing space S2 is measured by the pressure measuring part 15, the second valve 94b is opened and the first valve 94a is closed in the pressure-measuring pipeline unit 92, so that the capacitance manometers 91a and 91b communicate with the monitored processing space S2 and communication between the capacitance manometers 91a and 91b and the non-monitored processing space S1 is blocked. At this time, the fourth valve 97b of the dummy pipeline unit 95 is closed and the third valve 97a is opened. Accordingly, as for the monitored processing space S2, a pipeline route 99a is formed from the end of the second pressure-measuring pipeline 92b, which faces the processing space S2, through the second pressure-measuring pipeline 92b and the upper pipeline 93 to the connection portion of the capacitance manometer 91a, as shown in FIG. 3. Meanwhile, as for the non-monitored processing space S1, a dummy pipeline route 99b is formed from the end portion of the first pressure-measuring pipeline 92a, which faces the processing space S1, through the first pressure-measuring pipeline 92a, the first dummy pipeline 95a and the upper dummy pipeline 96 to the leading end of the upper dummy pipeline.

At this time, the dummy pipeline unit 95 (the first dummy pipeline 95a and the second dummy pipeline 95b) is configured to allow the pipeline route 98a and the dummy pipeline route 98b shown in FIG. 2 to have the same pipeline volume and to allow the pipeline route 99a and the dummy pipeline route 99b shown in FIG. 3 to have the same pipeline volume. It is also preferable that the dummy pipeline unit 95 is configured to allow the pipeline route 98a and the dummy pipeline route 98b to have the same conductance and the pipeline route 99a and the dummy pipeline route 99b to have the same conductance. It is most preferable in some embodiments that the pipeline route 98a and the dummy pipeline route 98b have the same shape, and the pipeline route 99a and the dummy pipeline route 99l) have the same shape.

The control part 16 has a CPU and further has a main controller configured to control the respective components of the substrate processing apparatus 100, for example, valves or flow rate controllers in the gas supply mechanism, the exhaust mechanism 14, the pressure measuring part 15, the temperature controller 63 and the like; an input device (keyboard, mouse, etc.); an output device (printer, etc.); a displaying device (display, etc.); and a storage device. By setting a storage medium with the processing recipe stored therein into the storage device, the main controller causes the substrate processing apparatus 100 to perform a predetermined operation based on the processing recipe retrieved from the storage medium.

Substrate Processing Operations

Next, substrate processing operations performed in the substrate processing apparatus will be described.

Two wafers Wa and Wb having etching target films such as silicon oxide films formed on surfaces thereof are loaded into the processing parts 11a and 11b in the chamber 10 and then mounted on the substrate mounting tables 61a and 61b, respectively. Then, depending on the processing recipe, the pressure measuring part 15 monitors a pressure in either of the processing space S1 of the processing part 11a and the processing space S2 of the processing part 11b.

Pressure adjusting gases such as Ar gas, N2 gas and $NH_3$ gas are supplied from the gas supply mechanism and introduced into the processing spaces S1 and S2 of the processing parts 11a and 11b via the gas introducing members 12a and 12b, while adjusting the interior of the chamber 10 to a predetermined pressure by the exhaust mechanism 14, thereby stabilizing the pressure. Since the processing parts 11a and 11b share the exhaust mechanism 14, the pressure adjustment in the chamber 10 is carried out by the common automatic pressure control valve (APC) 82, based on a pressure value in the monitored processing space, which is measured from the capacitance manometers 91a and 91b of the pressure measuring part 15. The pressure in the processing space which is higher than a predetermined pressure is monitored by the high-pressure capacitance manometer 91a, and a pressure in the processing space which is lower than the predetermined pressure is monitored by the low-pressure capacitance manometer 91b.

After performing such pressure adjustment. HF gas is also introduced into the processing spaces S1 and S2 while continuing to supply Ar gas, the $N_2$ gas and the $NH_3$ gas which have been supplied as the pressure adjusting gases, thereby performing an etching process (COR processing) on the silicon oxide film using HF gas and $NH_3$ gas.

At this time, the gases used for adjusting the pressure remain in the pipeline of the pressure measuring part 15 and are discharged during the etching process.

Figure 4:
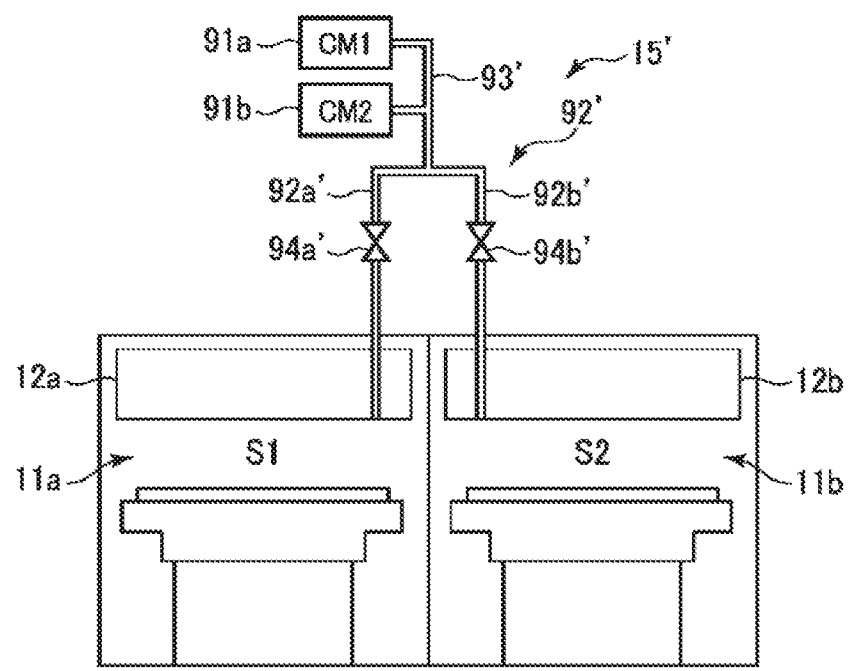
FIG. 4 is a view illustrating a pressure measuring part of a conventional substrate processing apparatus.

In a conventional case where one pressure measuring part is provided in common for the two processing parts 11a and 11b without considering influence on etching properties due to discharge of residual gases during the etching process, a pressure measuring part as shown in FIG. 4 has been utilized mainly in terms of the efficiency of the pipeline or the like. In other words, a conventional pressure measuring part 15' has the capacitance manometer 91a for a high pressure, the capacitance manometer 91b for a low pressure, and a pressure-measuring pipeline unit 92', wherein a first pressure-measuring pipeline 92a' and a second pressure-measuring pipeline 92b' of the pressure-measuring pipeline unit 92' are inserted into neighboring side portions of the gas introducing members 12a and 12b, respectively. In addition, an upper pipeline 93' to which the capacitance manometers 91a and 91b are directly connected is branched off into the first pressure-measuring pipeline 92a' and the second pressure-measuring pipeline 92b'.A first valve 94a' is provided in the first pressure-measuring pipeline 92a', and a second valve 94b' is provided in the second pressure-measuring pipeline 92b'.

In such a conventional pressure measuring part 15', when the processing space S1 of the processing part 11a is set as the monitored processing space and the processing space S2 of the processing part 11b is set as the non-monitored processing space, the valve 94a' is opened and the valve 94b' is closed. At this time, as indicated by a bold black line in FIG. 5, a length of the pipeline communicating with the monitored processing space S1 is the sum of a length of the first pressure-measuring pipeline 92a' and a length of the upper pipeline 93', whereas a length of the pipeline communicating with the non-monitored processing space S2 is a length from the processing space S2 to the valve 94b' of the second pressure-measuring pipeline 92b'. Accordingly, the lengths of both the pipelines are greatly different from each other and a volume of the pipeline communicating with the monitored processing space S1 is also greatly different from a volume of the pipeline communicating with the processing space S2.

When the pressure is adjusted by supplying Ar gas, $N_2$ gas and $NH_3$ gas, residual gases are gathered in the pipelines communicating with the processing spaces S1 and S2. However, since the volumes of the communicating pipelines are greatly different from each other as described above, the amount of residual gases in the monitored processing space S1 is greatly different from that in the non-monitored processing space S2.

Such residual gases are discharged during the etching process. As an etching process with higher accuracy has been needed in recent years, it has been found that the difference in the amounts of residual gases affects the etching process.

Further, since portions of the pipeline of the pressure measuring part 15', which communicate with the processing spaces S1 and S2, are placed at the side portions of the gas introducing members 12a and 12b, there is concern that in-plane uniformity of the etching process is degraded due to discharge of the residual gases.

Therefore, as for the pressure measuring part 15 in this embodiment, the dummy pipeline unit 95 having the first dummy pipeline 95a and the second dummy pipeline 95b for adjusting the volumes of the pipelines communicating with the processing spaces S1 and S2 is provided in the first pressure-measuring pipeline 92a and the second pressure-measuring pipeline 92b which communicate with the processing spaces S1 and S2, respectively. By providing the first dummy pipeline 95a and the second dummy pipeline 95b as described above, the volume of the pipeline communicating with the non-monitored processing space may be adjusted so that it is possible to alleviate the difference between the discharge amounts of residual gases in the monitored processing space and the non-monitored processing space during the etching process.

At this time, the first pressure-measuring pipeline 92a is inserted into the gas introducing member 12a from above so as to face the processing space S1, the second pressure-measuring pipeline 92b is inserted into the gas introducing member 12b from above so as to face the processing space S2, and the first and second pressure-measuring pipelines are caused to be opened/closed by the first and second valves 94a and 94b, respectively. Further, the first dummy pipeline 95a and the second dummy pipeline 95b are connected to the first pressure-measuring pipeline 92a and the second pressure-measuring pipeline 92b, respectively, to allow these dummy pipelines to be opened and closed by the third valve 97a and the fourth valve 97b, respectively.

Specifically, when the processing space S1 is set as the monitored processing space and the processing space S2 is set as the non-monitored processing space, the first valve 94a is opened, the second valve 94b is closed, the third valve 97a is closed, and the fourth valve 97b is opened. Accordingly, as shown in FIG. 2, the pipeline route 98a is formed from the end of the first pressure-measuring pipeline 92a, which faces the processing space S1, through the first pressure-measuring pipeline 92a and the upper pipeline 93 to the connection portion of the capacitance manometer 91a. In addition, the dummy pipeline route 98b is formed from the end of the second pressure-measuring pipeline 92b, which faces the processing space S2, through the second pressure-measuring pipeline 92b, the second dummy pipeline 95b and the upper dummy pipeline 96 to the leading end of the upper dummy pipeline.

Meanwhile, when the processing space S2 is set as the monitored processing space and the processing space S1 is set as the non-monitored processing space, the first valve 94a is closed, the second valve 94b is opened, the third valve 97a is opened, and the fourth valve 97b is closed. Accordingly, as shown in FIG. 3, the pipeline route 99a is formed from the end of the second pressure-measuring pipeline 92b, which faces the processing space S2, through the second pressure-measuring pipeline 92a and the upper pipeline 93 to the connection portion of the capacitance manometer 91a, and the dummy pipeline route 99b is formed from the end of the first pressure-measuring pipeline 92a, which faces the processing space S1, through the first pressure-measuring pipeline 92a, the first dummy pipeline 95a and the upper dummy pipeline 96 to the leading end of the upper dummy pipeline.

In addition, as the first dummy pipeline 95a and the second dummy pipeline 95b are configured such that the pipeline route 98a and the dummy pipeline route 98b in FIG. 2 have the same pipeline volume when the processing space S1 is set as the monitored processing space and the processing space S2 is set as the non-monitored processing space, and such that the pipeline route 99a and the dummy pipeline route 99b in FIG. 3 have the same pipeline volume when the processing space S2 is set to the monitored processing space and the processing space S1 is set to the non-monitored processing space, the amounts of residual gases in the monitored processing space and the non-monitored processing space can be equal to each other. Thus, the discharge amounts of residual gases in the monitored processing space and the non-monitored processing space can be equal to each other during the etching process, thereby limiting a variation in the etching process in the monitored processing space and the non-monitored processing space.

Moreover, since the first pressure-measuring pipeline 92a and the second pressure-measuring pipeline 92b are inserted into the centers of the gas introducing members 12a and 12b, respectively, from above, the residual gases therein are discharged to centers of the wafers Wa and Wb. Therefore, the influence of the residual gases on the in-plane uniformity of the etching process can be reduced.

Figure 6A:
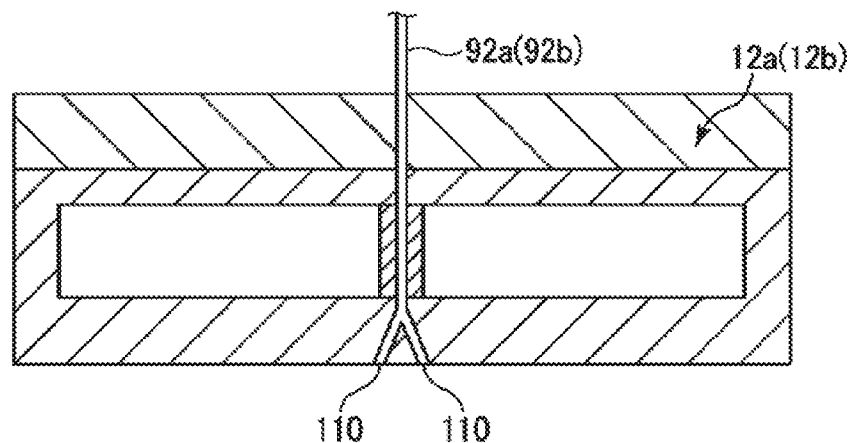
FIGS. 6A and 6B are views illustrating a modified example of a pipeline outlet from a pressure-measuring pipeline to the processing space.
Figure 6B:
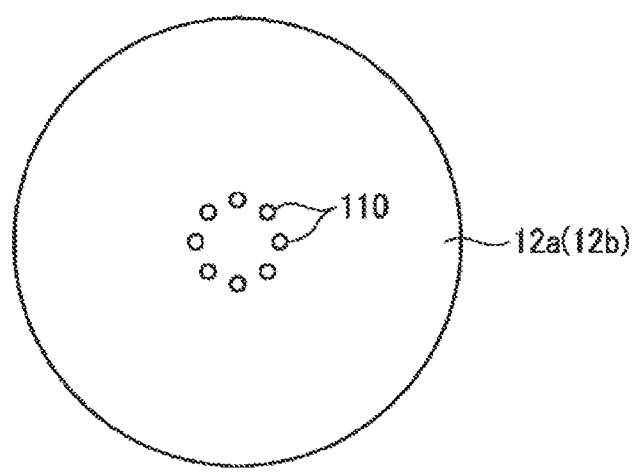

Furthermore, locations where the first pressure-measuring pipeline 92a and the second pressure-measuring pipeline 92b are disposed are not limited to the centers of the gas introducing members 12a and 12b, and any location may be employed so far as it is a location where the discharge of the residual gases can reduce the influence on the in-plane uniformity. For example, in a case where the discharge location of the residual gases is the center of the wafer, if an etching rate at the center of the wafer is extremely lowered due to the discharge of the residual gases, a distal end of the pressure-measuring pipeline 92a (92b) may be branched off to provide a plurality of outlets 110 on a concentric circle around a center of the bottom portion of the gas introducing member 12a (12b), as shown in FIGS. 6A and 6B.

Figure 7:
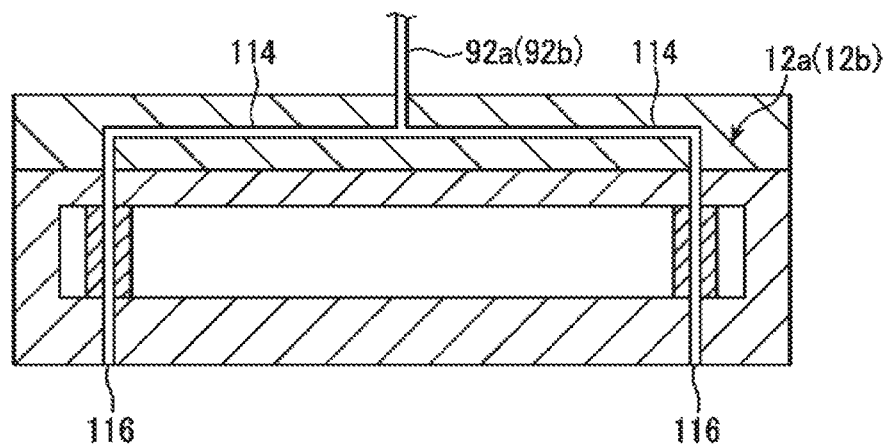
FIG. 7 is a view illustrating another modified example of the pipeline outlet from the pressure-measuring pipeline to the processing space.

Moreover, the residual gases remaining in the pipeline of the pressure measuring part 15 can be positively used to control the etching process. Specifically, an outlet in the form of a concentric circular slit or a plurality of concentrically disposed outlets may be provided to discharge the residual gases to radial locations where the etching rate is desired to be lowered. For example, if there is a need to lower the etching rate at an outer periphery of the wafer, the pressure-measuring pipeline 92a (92b) is branched off into a plurality of branch passages 114 and an outlet 116 in the form of a concentric circular slit may be provided at an outer periphery of the bottom portion of the gas introducing member 12a (12b), as shown in FIG. 7, Alternatively, a plurality of outlets 116 may be provided on a concentric circle.

Further, in the case where the residual gases are positively used to control the etching process, a plurality of discharge ports may be formed beforehand at the center and predetermined radial locations of the bottom portion of the gas introducing member 12a (12b), and only one or more of the discharge ports, which is desired, may be employed.

Other Applications

Although the present disclosure has been described in accordance with one embodiment, the present disclosure is not limited to the embodiment and various modifications can be made without departing from the spirit of the present disclosure.

Figure 8:
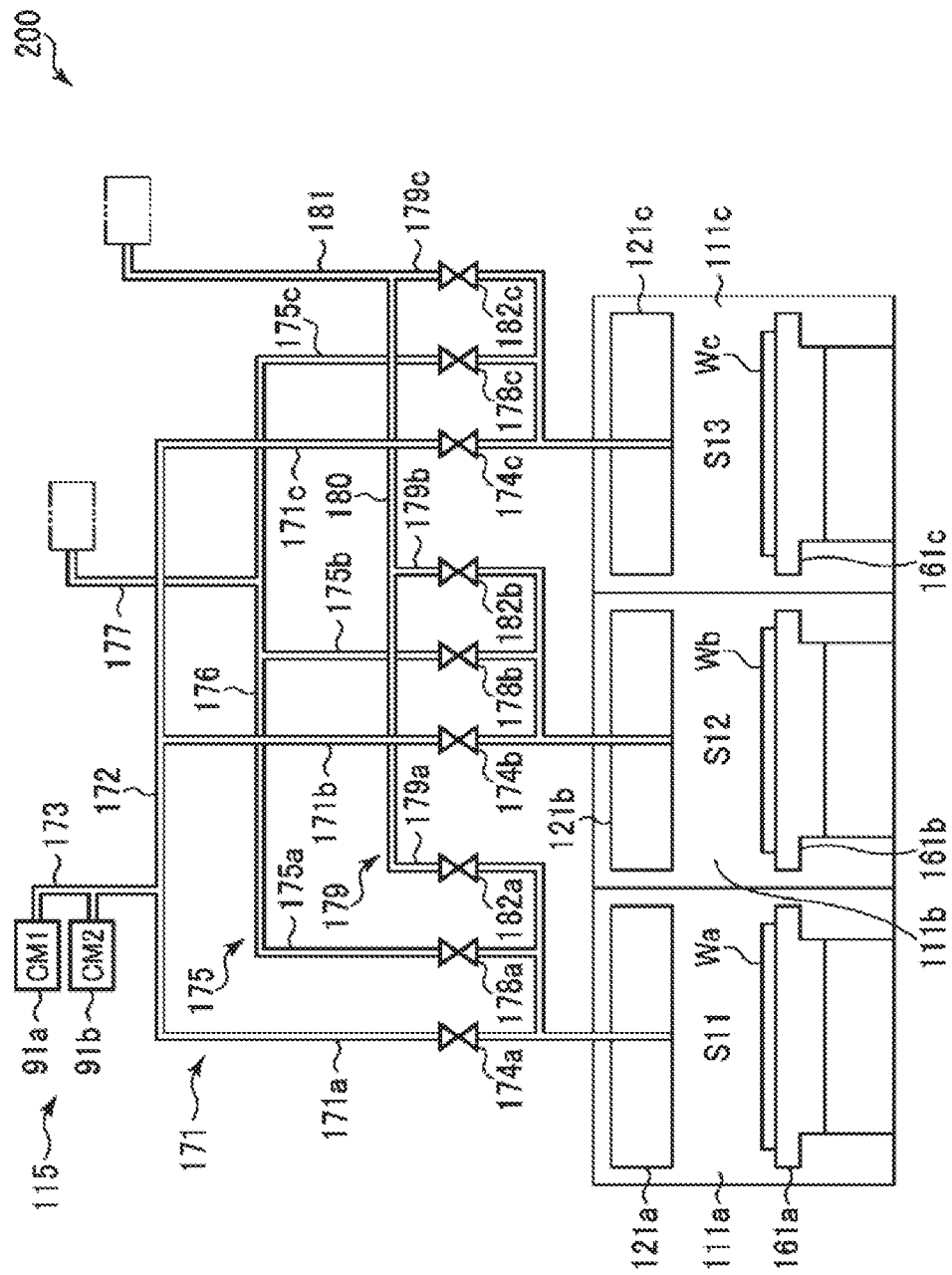
FIG. 8 is a sectional view showing a substrate processing apparatus according to another embodiment of the present disclosure.

Although the aforementioned embodiment has been described in connection with the case where the two processing parts are provided, three or more processing parts may be provided. FIG. 8 shows an embodiment in which three processing parts are provided. FIG. 8 is a schematic view and shows only main parts. The substrate processing apparatus 200 according to this embodiment has three processing parts 111a, 111b and 111c which are partitioned by inner walls. The processing parts 111a, 111b and 111c are provided with substrate mounting tables 161a, 161b and 161c, respectively, and wafers Wa, Wb and Wc are mounted on the respective substrate mounting tables. Gas introducing members 121a, 121b and 121c are provided above the substrate mounting tables 161a, 161b and 161c, respectively. Processing spaces S11, S12 and S13 are formed in the processing parts 111a, 111b and 111c, respectively.

A pressure measuring part 115 has the capacitance manometer 91a for high pressure and the capacitance manometer 91b for low pressure which serve as pressure gauges and further has a pressure-measuring pipeline unit 171, a first dummy pipeline unit 175 and a second dummy pipeline unit 179.

The pressure-measuring pipeline unit 171 has a pressure-measuring pipeline 171a inserted into a center of the gas introducing member 121a and reaching the processing space S11, a pressure-measuring pipeline 171b inserted into a center of the gas introducing member 121b and reaching the processing space S12, a pressure-measuring pipeline 171c inserted into a center of the gas introducing member 121c and reaching the processing space S13, a common pipeline 172 for connecting these pipelines, and an upper pipeline 173 extending upward from the common pipeline 172 and directly connected to the capacitance manometers 91a and 91b. Valves 174a, 174b and 174c are provided in the pressure-measuring pipelines 171a, 171b and 171c, respectively.

The first dummy pipeline unit 175 has a dummy pipeline 175a connected to the pressure-measuring pipeline 171a, a dummy pipeline 175b connected to the pressure-measuring pipeline 171b, a dummy pipeline 175c connected to the pressure-measuring pipeline 171c, a common dummy pipeline 176 for connecting these dummy pipelines, and an upper dummy pipeline 177 extending upward from the common dummy pipeline 176. Valves 178a, 178b and 178c are provided in the dummy pipelines 175a, 175b and 175c, respectively. A leading end of the upper dummy pipeline 177 is occluded. In addition, the leading end of the upper dummy pipeline 177 may be configured to be mounted with a capacitance manometer for checking a pressure.

The second dummy pipeline unit 179 has a dummy pipeline 179a connected to the pressure-measuring pipeline 171a, a dummy pipeline 179b connected to the pressure-measuring pipeline 171b, a dummy pipeline 179c connected to the pressure-measuring pipeline 171c, a common dummy pipeline 180 for connecting these dummy pipelines, and an upper dummy pipeline 181 extending upward from the common dummy pipeline 180. Valves 182a, 182b and 182c are provided in the dummy pipelines 179a, 179b and 179c, respectively. A leading end of the upper dummy pipeline 181 is occluded. In addition, the leading end of the upper dummy pipeline 181 may be configured to be mounted with a capacitance manometer for checking pressure.

In this substrate processing apparatus 200, when pressure monitoring by the pressure measuring part 115 is performed, for example, on the processing space S12 of the processing part 111b, i.e., when the processing space S12 of the processing part 111b is the monitored processing space and the processing spaces S11 and S13 of the processing parts 111a and 111c are the non-monitored processing spaces, the valves 174b, 178c and 182a are opened and the other valves are closed, as shown in FIG. 9. Accordingly, as for the monitored processing space S12, a pipeline route 191 indicated by a black line is formed from an end of the pressure-measuring pipeline 171b, which faces the processing space S12, through the pressure-measuring pipeline 171b, the common pipeline 172 and the upper pipeline 173 to the connection portion of the capacitance manometer 91a. In addition, as for the non-monitored processing space S13, a first dummy pipeline route 192 indicated by a black line is formed from an end of the pressure-measuring pipeline 171c, which faces the processing space S13, through the pressure-measuring pipeline 171c, the dummy pipeline 175c and the common dummy pipeline 176 to the upper dummy pipeline 177. Further, as for the other non-monitored processing space S11, a second dummy pipeline route 193 indicated by a black line is formed from an end of the pressure-measuring pipeline 171a, which faces the processing space S11, through the pressure-measuring pipeline 171a, the dummy pipeline 179a and the common dummy pipeline 180 to the upper dummy pipeline 181.

By providing the first dummy pipeline unit 175 and the second dummy pipeline unit 179 as described above, a volume of the pipeline communicating with the non-monitoring-side processing space may be adjusted so that it is possible to alleviate the difference between the discharge amount of residual gas in the monitored processing space and the discharge amount of residual gas in the non-monitored processing space during the etching process. Specifically, since the first dummy pipeline unit 175 and the second dummy pipeline unit 179 are configured such that the pipeline route 191, the first dummy pipeline route 192 and the second dummy pipeline route 193 in FIG. 9 have the same pipeline volume, it is possible to make the discharge amount of residual gases in the monitored processing space equal to the discharge amount of residual gases in each of the non-monitored processing spaces during the etching process.

Even when the processing space S13 is the monitored processing space or when the processing space S11 is the monitored processing space, the valves are manipulated in a similar manner, so that it is possible to alleviate the difference between the discharge amounts of residual gases in the monitored processing space and the non-monitored processing spaces by means of the functions of the first dummy pipeline unit 175 and the second dummy pipeline unit 179.

In this embodiment in which there are three processing spaces, since a total of three pipelines, i.e., one pressure-measuring pipeline and two dummy pipelines, are connected to each of the processing spaces, and the opening/closing valves are provided in these pipelines, both the total number of the pipelines and the total number of the valves are nine (9). In the previous embodiment where there are two processing spaces, since a total of two pipelines consisting of one pressure-measuring pipeline and one dummy pipeline are provided in each of the processing spaces, and the valves are provided in these pipelines, both the total number of the pipelines and the total number of the valves are four (4).

From the foregoing, assuming that the number of the processing parts is "n", by connecting one pressure-measuring pipeline and (n–1) dummy pipelines to each of the processing parts, and by making the total number of the pipelines and the total number of the valves for opening/closing the pipelines equal to the square of the number of the processing spaces, it can be found that it is possible to alleviate the difference between the discharge amounts of residual gases in a monitored processing space and a non-monitored processing space even when any one of the processing spaces is set as the monitored processing space and also to make the discharge amounts of residual gases in the monitored processing space and the non-monitored processing space equal to each other.

Although the COR processing performed using the HF gas and the $NH_3$ gas has been described in the embodiments, the present disclosure is not limited thereto but may be applied to an etching process performed using other gases or to other processes using gases such as film forming process.

Furthermore, although the embodiments have been described by way of example in connection with the case where the target substrate is the semiconductor wafer, it is apparent that the target substrate is not limited to the semiconductor wafer in view of the spirit of the present disclosure and the present disclosure can be applied to processing of a variety of substrates.

According to the present disclosure, in the pressure measuring part having the pressure gauge and selectively monitoring the pressure in any one of the plurality of processing spaces with the pressure gauge, the dummy pipeline is provided to adjust a difference between the volume of the pipeline communicating with the monitored processing space and the volume of the pipeline communicating with the non-monitored processing space, Whereby the influence on a process by the residual gases in the pipeline can be reduced between the monitored processing space and the non-monitored processing space. Moreover, by providing the dummy pipeline such that the volume of the pipeline communicating with the monitored processing space is equal to the volume of the pipeline communicating with the non-monitored processing space, it is possible to further reduce the influence of the residual gases in the pipeline on the process.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
   a plurality of processing parts configured to perform substrate processing on target substrates, respectively;
   a plurality of substrate mounting tables configured to mount, the target substrates thereon in each of the plurality of processing parts;
   a plurality of gas introducing members configured to introduce processing gases into a plurality of processing spaces corresponding to the plurality of processing parts, respectively;
   a common exhaust mechanism configured to evacuate the plurality of processing spaces of the plurality of processing parts all at once and further to perform pressure control for the plurality of processing spaces all at once; and
   a pressure measuring part selectively monitoring pressure in any one of the plurality of processing spaces,
   wherein the pressure measuring pail includes a pressure gauge,
   wherein the pressure measuring part further includes pipelines having pressure-measuring pipelines connecting the plurality of processing spaces to the pressure gauge, dummy pipelines communicating with the plurality of processing spaces, a plurality of valves switching among the pressure-measuring pipelines and among the dummy pipelines, and a plurality of branch points,
   wherein the plurality of branch points includes a first branch point and a second branch point,
   wherein one terminal end of one of the dummy pipelines is branched from the first branch point in one of the pressure-measuring pipelines,
   wherein one terminal end of another of the dummy pipelines is branched from the second branch point in another of the pressure-measuring pipelines,
   wherein each of the first branch point and the second branch point is disposed between the pressure gauge and the plurality of processing spaces,
   wherein an opposite terminal end of each of the dummy pipelines is occluded,
   wherein the plurality of valves include: a first valve installed in one of the pressure-measuring pipelines between the first branch point and the pressure gauge; a second valve installed in another of the pressure-measuring pipelines between the second branch point and the pressure gauge; a third valve installed in one of the dummy pipelines between the first branch point and the opposite terminal end; and a fourth valve installed in another of the dummy pipelines between the second branch point and the opposite terminal end; and
   wherein the dummy pipelines are configured to adjust a difference between a volume of the pipelines communicating with a monitored processing space among the plurality of processing spaces and a volume of the pipelines communicating with each of the processing spaces that are non-monitored among the plurality of processing spaces.

2. The apparatus of claim 1, further comprising a controller configured to control the plurality of valves,
   wherein the plurality of processing pails consists of n processing parts,
   wherein each processing part includes one pressure-measuring pipeline and (n–1) dummy pipelines communicate with each of the plurality of processing spaces,
   wherein n is a natural number greater than or equal to 2, and
   wherein the controller is configured to, in the monitored processing space, open the first valve or the second valve provided in the pressure-measuring pipeline to allow the corresponding processing space to communicate with the pressure gauge, and close the third valve or the fourth valve provided in the dummy pipeline; and the controller is configured to, in the processing spaces that are non-monitored, open the third valve or the fourth valve provided in any one of the dummy pipelines such that the corresponding processing space communicates with the dummy pipeline in which the third valve or the fourth valve is opened.

3. The apparatus of claim 2, wherein a total number n of the plurality of processing parts follows an equation:

$$n^2 = P1 + P2 = V,$$

where P1 is a total number of the pressure-measuring pipelines, P2 is a total number of the dummy pipelines, and V is a total number of the plurality of valves provided in the pressure-measuring pipeline and the dummy pipelines.

4. A substrate processing apparatus, comprising:
two processing parts configured to perform substrate processing on target substrates, respectively,
two mounting tables configured to mount the target substrates thereon in each of the two processing parts;
two gas introducing members configured to introduce processing gases into two processing spaces of the two processing parts;
a common exhaust mechanism configured to evacuate both of the two processing
spaces of the two processing parts all at once and further to perform pressure control for the two processing spaces all at once;
a pressure measuring part selectively monitoring a pressure in any one of the two processing spaces; and
a controller configured to control the pressure measuring part,
wherein the pressure measuring part includes a pressure gauge,
wherein the pressure measuring part further includes pipelines having two pressure-measuring pipelines connecting the two processing spaces to the pressure gauge, two dummy pipelines communicating with the two pressure-measuring pipelines, respectively, a plurality of valves provided in the two pressure-measuring pipelines and the two dummy pipelines, respectively, and a plurality of branch points,
wherein the plurality of branch points includes a first branch point and a second branch point,
wherein one terminal end of one of the two dummy pipelines is branched from the first branch point in one of the two pressure-measuring pipelines,
wherein one terminal end of another of the two dummy pipelines is branched from the second branch point in another of the two pressure-measuring pipelines,
wherein each of the first branch point and the second branch point is disposed between the pressure gauge and the two processing spaces,
wherein an opposite terminal end of each of the two dummy pipelines is occluded,
wherein the plurality of valves include: a first valve installed in one of the two pressure-measuring pipelines between the first branch point and the pressure gauge; a second valve installed in another of the two pressure-measuring pipelines between the second branch point and the pressure gauge; a third valve installed in one of the two dummy pipelines between the first branch point and the opposite terminal end; and a fourth valve installed in another of the two dummy pipelines between the second branch point and the opposite terminal end,
wherein, in a monitored processing space of the two processing spaces where a pressure is monitored, the controller is configured to open the first valve or the second valve provided in the pressure-measuring pipeline to allow the corresponding processing space to communicate with the pressure gauge, and close the third valve or the fourth valve provided in the dummy pipeline,
wherein, in a non-monitored processing space of the two processing spaces where a pressure is not monitored, the controller is configured to open the third valve or the fourth valve provided in the dummy pipeline such that the corresponding processing space communicates with the dummy pipeline, and
wherein the dummy pipelines are configured to adjust a difference between a volume of the pipelines communicating with the monitored processing space and a volume of the pipelines communicating with the non-monitored processing space.

5. The apparatus of claim 1, wherein the dummy pipeline is configured to make the volume of the pipelines communicating with the monitored processing space equal to the volume of the pipelines communicating with each of the processing spaces that are non-monitored.

6. The apparatus of claim 5, wherein the dummy pipeline is configured to make conductance of a route of the pipelines communicating with the monitored processing space equal to conductance of a route of the pipelines communicating with each of the processing spaces that are non-monitored.

7. The apparatus of claim 1, wherein the pressure-measuring pipeline is inserted into a center of the gas introducing member from above the gas introducing member of each of the plurality of processing parts.

8. The apparatus of claim 7, wherein the pressure-measuring pipeline has outlets communicating with the processing space and arranged on a concentric circle around the center of the gas introducing member.

9. The apparatus of claim 1, wherein the pressure-measuring pipeline has outlets communicating with the processing space and arranged on a concentric circle around a center of the gas introducing member at any radial location.

10. The apparatus of claim 1, wherein in each of the plurality of processing spaces, the gas introducing member is formed with a plurality of outlets corresponding to the pressure-measuring pipeline.

* * * * *